United States Patent
Zhang et al.

(10) Patent No.: US 10,319,910 B2
(45) Date of Patent: Jun. 11, 2019

(54) ORGANIC ELECTROLUMINESCENT DIODE AND METHOD FOR MANUFACTURING HOLE TRANSPORTING LAYER THEREOF

(71) Applicant: Shenzhen China Star Optoelectronics Technology Co., Ltd., Shenzhen, Guangdong (CN)

(72) Inventors: Yunan Zhang, Guangdong (CN); Yawei Liu, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 15/324,507

(22) PCT Filed: Oct. 24, 2016

(86) PCT No.: PCT/CN2016/103053
§ 371 (c)(1),
(2) Date: Aug. 30, 2017

(87) PCT Pub. No.: WO2018/032604
PCT Pub. Date: Feb. 22, 2018

(65) Prior Publication Data
US 2018/0123041 A1    May 3, 2018

(51) Int. Cl.
*H01L 51/00* (2006.01)
*H01L 51/56* (2006.01)
(Continued)

(52) U.S. Cl.
CPC .......... *H01L 51/0006* (2013.01); *H01L 51/56* (2013.01); *H01L 51/0035* (2013.01);
(Continued)

(58) Field of Classification Search
None
See application file for complete search history.

(56) References Cited

U.S. PATENT DOCUMENTS

| 7,241,512 B2* | 7/2007 | Li | C08G 61/02 252/301.35 |
| 2001/0051284 A1* | 12/2001 | Ueda | H01L 51/5092 428/690 |
| 2009/0321723 A1* | 12/2009 | Hoshi | C08G 73/026 257/40 |

FOREIGN PATENT DOCUMENTS

| CN | 1822410 | 8/2006 |
| CN | 101051673 | 10/2007 |

(Continued)

*Primary Examiner* — Michelle Mandala

(57) ABSTRACT

Provided is a multilayer-structured organic electroluminescent diode, and a method of manufacturing a hole transporting layer thereof. The hole transporting layer included in the organic electroluminescent diode is a thin film formed through electrochemical polymerization. The method of manufacturing the hole transporting layer includes the steps of: preparing an electrolyte; electro-polymerizing the electrolyte; controlling thickness of an electropolymerized film; and washing and drying the electropolymerized film as obtained. Specific electropolymerization parameters are set to finely regulate a crosslinking degree and reactivity of the electropolymerized film, thereby solving a prior-art problem that the crosslinking degree and reactivity of a polymer or small molecule hole transporting material in a film state cannot be effectively controlled.

7 Claims, 3 Drawing Sheets

(51) Int. Cl.
 *H01L 51/50* (2006.01)
 *H01L 51/52* (2006.01)
(52) U.S. Cl.
 CPC ...... *H01L 51/0037* (2013.01); *H01L 51/0039* (2013.01); *H01L 51/0059* (2013.01); *H01L 51/5012* (2013.01); *H01L 51/5056* (2013.01); *H01L 51/5088* (2013.01); *H01L 51/5092* (2013.01); *H01L 51/5206* (2013.01); *H01L 51/5221* (2013.01); *H01L 2251/301* (2013.01); *H01L 2251/308* (2013.01); *H01L 2251/552* (2013.01); *H01L 2251/558* (2013.01); *H01L 2251/566* (2013.01)

(56) References Cited

FOREIGN PATENT DOCUMENTS

| | | |
|---|---|---|
| CN | 101293961 | 10/2008 |
| CN | 101392173 | 3/2009 |
| CN | 103396532 | 11/2013 |
| CN | 105576145 | 5/2016 |

\* cited by examiner

ORGANIC ELECTROLUMINESCENT DIODE AND METHOD FOR MANUFACTURING HOLE TRANSPORTING LAYER THEREOF

CROSS-REFERENCE TO RELATED APPLICATIONS

The present application claims the priority of Chinese patent application CN 201610697355.X, entitled "Organic electroluminescent diode and method for manufacturing hole transporting layer thereof" and filed on Aug. 19, 2016, the entirety of which is incorporated herein by reference.

FIELD OF THE INVENTION

The present disclosure relates to the field of manufacture of organic electroluminescent diodes, and more particularly, to an organic electroluminescent diode and a method for producing a hole transporting layer thereof.

BACKGROUND OF THE INVENTION

Organic electroluminescence refers to a phenomenon that a thin film device made of an organic photoelectric functional material emits light under the excitation of an electric field. According to different luminescent materials used in the preparation of the functional film, the thin film devices can be divided into organic electroluminescent diodes and polymer electroluminescent diodes. In recent years, organic electroluminescent diodes have made great progress, and satisfied practical requirements in the aspects of luminous brightness, luminous efficiency, and service life.

Electrochemical polymerization (ECP) refers to polymerization of a monomer occurring, after specific electrochemical electrolysis in an electrolytic cell with a proper electrolyte, on an electrode due to oxidation, reduction, or decomposition of the monomer into free radicals, ions, or the like. ECP can also be referred to as electrolytic polymerization, electropolymerization, or electron-initiated polymerization.

ECP has the following characteristics:

(1) reactions occur in a simple device under conditions easy to control, and thickness of a polymer film can be controlled;

(2) the polymer film has homogeneous thickness and high reproducibility;

(3) functional films of different structures and features can be obtained;

(4) various conductive polymers can be synthesized; and (5) doping can be performed at the same time as the monomer is being polymerized.

In recent years, inkjet printing micro-manufacturing technology has been widely used in the field of manufacture of organic electroluminescent diodes. In preparing organic electroluminescent diodes through existing inkjet printing procedures, a crosslinkable hole transporting layer is usually prepared to solve the problem of mutual miscibility between layers in a solution processing device. However, it is difficult to effectively control a crosslinking degree and reactivity of a polymer or a small-molecule hole transporting material in a thin film state.

SUMMARY OF THE INVENTION

In order to solve the above-mentioned problem existing in the prior art, the present disclosure provides an organic electroluminescent diode and a method for manufacturing a hole transporting layer thereof.

The organic electroluminescent diode according to the present disclosure includes a hole transporting layer, which is a thin film formed through electrochemical polymerization.

Optionally, the organic electroluminescent diode comprises: a substrate, and an anode, a hole injection layer, the hole transporting layer, a light-emitting layer, an electron injection layer, and a cathode that are successively stacked on the substrate from inside to outside.

Optionally, material of the hole transporting layer is a "star" triphenylamine compound.

Optionally, the anode is an indium tin oxide semiconductor transparent conductive film.

Optionally, the hole injection layer is a poly(3,4-ethenyl-dioxythiophene)poly(styrene sulfonate) film.

Optionally, the light-emitting layer is a poly 9,9-dioctyl-fluorene film.

Optionally, the electron injection layer is a lithium fluoride film.

Optionally, the cathode is an aluminum film.

The method of manufacturing a hole transporting layer of an organic electroluminescent diode comprises the steps of:

preparing an electrolyte;

electro-polymerizing the electrolyte by cyclic voltammetry based on a three-electrode system;

controlling thickness of an electropolymerized film;

washing and drying the electropolymerized film as obtained; and using the electropolymerized film to form the hole transporting layer, wherein a precursor in the electrolyte comprises at least one type of electroactive substituent groups; and wherein each precursor molecule comprises at least two similar electroactive substituent groups.

Optionally, the electroactive substituent groups are thiophene substituent groups, aniline substituent groups, or carbazole substituent groups.

The hole transporting layer included in the organic electroluminescent diode according to the present disclosure is a thin film made through an electrochemical polymerization procedure. The thin film has superior stability and corrosion resistance due to its highly crosslinked molecular structure, and can effectively resist erosion of a solvent during a next layer of solution processing. Hence, the thin film plays a role in interface modification and protection, and thus facilitates subsequent preparation of other functional layers in a multilayer structure through a solution processing procedure.

More importantly, the properties of the electropolymerized film, such as a crosslinking degree, reactivity, thickness, and surface morphology, can be finely regulated by setting specific electropolymerization parameters, including polymerization potential, scanning rate, solvent, electrolyte, eluent, etc. Therefore, the present disclosure satisfactorily solves the problem in the prior art that the crosslinking degree and reactivity of a polymer or small molecule hole transporting material cannot be effectively controlled in a film state.

BRIEF DESCRIPTION OF THE DRAWINGS

In the following, an organic electroluminescent diode having a multilayer structure, and a method for manufacturing a hole transporting layer thereof according to the present disclosure will be explained in more detail with reference to embodiments and accompanying drawings, in which.

In the accompanying drawings, the same components are indicated by the same reference signs. The accompanying drawings are not drawn to an actual scale.

DETAILED DESCRIPTION OF THE EMBODIMENTS

An organic electroluminescent diode and a hole transporting layer thereof according to the present disclosure will be described in further detail with reference to the accompanying drawings.

Embodiment 1

Figure 1:
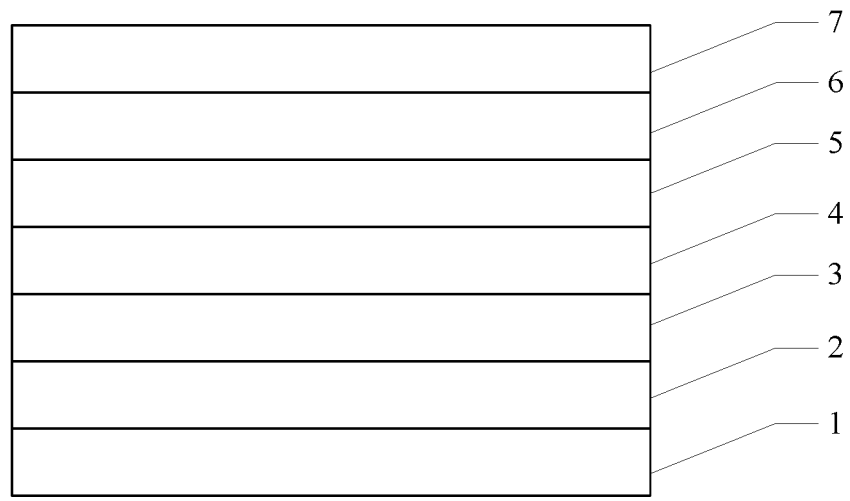
FIG. 1 schematically shows the structure of an organic electroluminescent diode in an embodiment.

The present embodiment will be described in connection with FIGS. 1, 2, 3, 4, and 5. As shown in FIG. 1, an organic electroluminescent diode having a multilayer structure in the present embodiment includes a substrate 1, and an anode 2, a hole injection layer 3, a hole transporting layer 4, a light-emitting layer 5, an electron injection layer 6, and a cathode 7 that are successively stacked on the substrate 1 from inside to outside.

The hole transporting layer 4 is a thin film made by electrochemical polymerization, and the thin film is made of a "star" triphenylamine compound having a thickness in the range from 0.1 to 100 nm.

The triphenylamine compound has an energy level of up to $10^{-3}$ $cm^2 \cdot V^{-1} \cdot s^{-1}$, high intrinsic hole mobility, superior electron donation, low ionization potential, favorable solubility, strong fluorescence and light stability, amorphous film-forming property, and other advantages, and therefore has always been a hot topic in the field of organic semiconductor materials.

Figure 2:
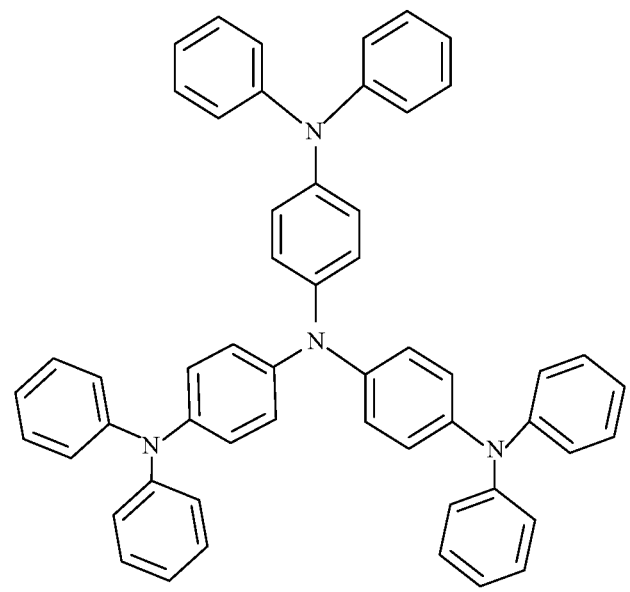
FIG. 2 is a structural formula of TDATA series "star" triphenylamine compounds in an embodiment, wherein N is a nitrogen group.
Figure 3:
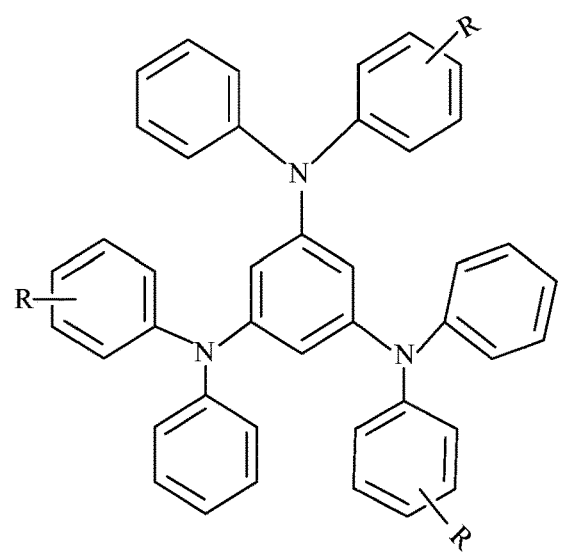
FIG. 3 is a structural formula of TDAB series "star" triphenylamine compounds in an embodiment, wherein R is an R group.
Figure 4:
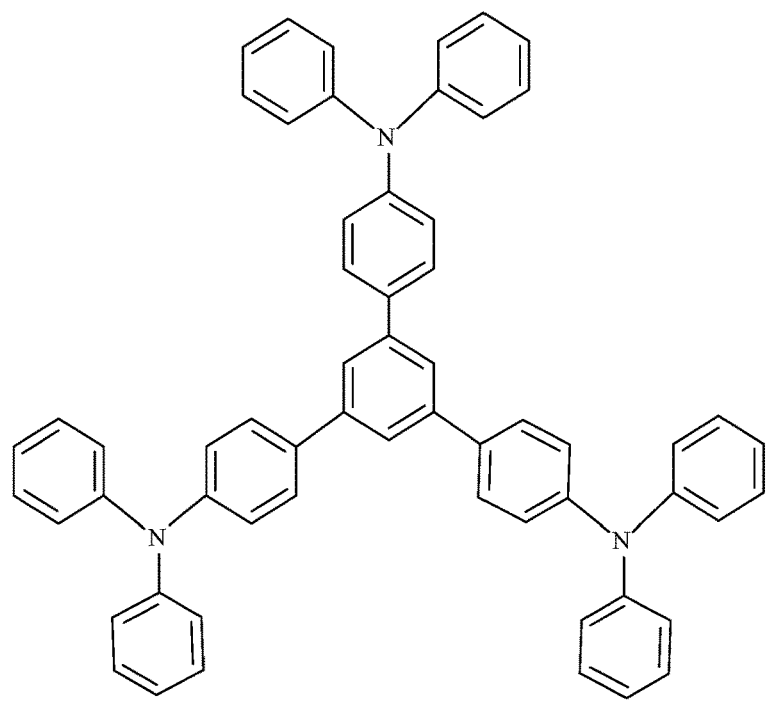
FIG. 4 is a structural formula of TDAPB series "star" triphenylamine compounds in an embodiment.

"Star" triphenylamine compounds can be substantially divided into TDATA series (with triphenylamine as a center), TDAB series (with benzene ring as a center), and TDAPB series (with 1,3,5 triphenyl benzene as a center), their general structural formula being shown in FIG. 2, FIG. 3, and FIG. 4, respectively. The R group in FIG. 3 may be an alkoxy group, an alkyl group, an olefin group, an aromatic ring, a condensed ring, or the like. These different series of "star" triphenylamine compounds all have high glass transition temperatures, favorable film-forming property, and satisfactory visible light transmission. In addition, a star geometry structure renders the compound difficult to be grouped. As a result, the solubility of the "star" triphenylamine in a solvent is much better than linear triphenylamine. Most importantly, the star structure enlarges a conjugate area of the triphenylamine compound, and its highest occupied molecular (HOMO) level is significantly improved, which is more favorable for hole injection.

When a specific bias voltage is applied to the organic electroluminescent diode, electrons and holes are injected via the cathode and the anode, respectively. Two types of charges are transferred to corresponding transporting layers, and then, driven by an external electric field, carriers reach an interface of the light-emitting layer and form excitons (electron-hole pairs) at an excited state. At this point, the excitons at the excited state are of high energy at an unstable state, and will release energy in the form of light or heat and return to a steady state. With different light-emitting materials, the organic electroluminescent diode will emit different colors of light.

It is necessary for a hole transporting material, as a functional layer material in an organic electroluminescent diode device, to satisfy the following requirements: (1) having high hole mobility; (2) capable of forming a homogeneous and stable film; (3) at a suitable orbital energy level and thus capable of being matched with other functional layers; and (4) having good thermal stability and being uneasy to form crystals. A triphenylamine compound can form cationic radicals under an electric field, and thus has favorable hole mobility, high glass transition temperature, and satisfactory thermal stability and chemical stability. Therefore, a "star" triphenylamine compound is selected as a material for the hole transporting layer in the present embodiment.

A "star" triphenylamine compound film is prepared by method of electrochemical polymerization, and the method comprises the following steps.

In step 1, an electrolyte containing aniline substituent groups is prepared.

Figure 5:
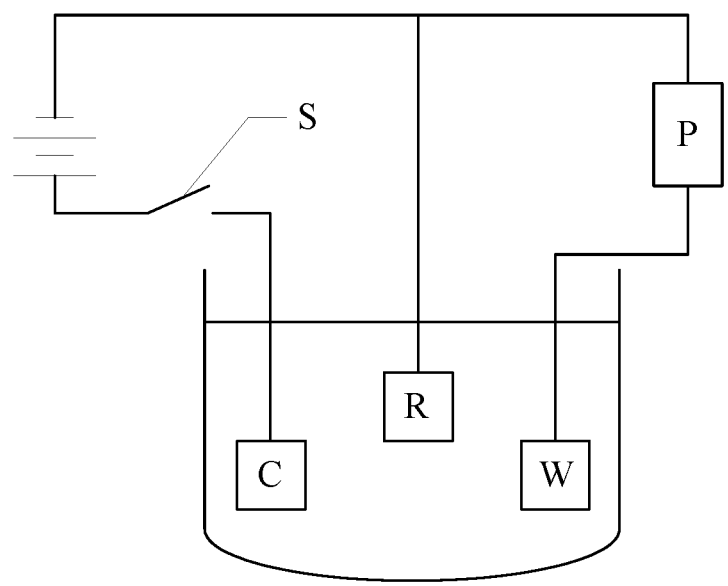
FIG. 5 schematically shows the structure of a three-electrode system in an embodiment, wherein P, C, F, W, and S refer to chemical workstation, counter electrode, reference electrode, working electrode, and switch, respectively.

In step 2, a three-electrode system device as shown in FIG. 5 is built, a counter electrode C, a reference electrode F, and a working electrode W all being in the electrolyte.

In step 3, a switch S is turned off and thickness of a resulting electropolymerized thin film is controlled in the range from 0.1 to 100 nm by control of the number of polymerization cycles.

It is possible to obtain electropolymerized films of different materials through preparation of electrolytes containing different precursors. Precursor molecules in the electrolytes contain at least one type of electroactive substituent groups selected from thiophene substituent groups, aniline substituent groups, carbazole substituent groups, and the like.

The electrochemical polymerization method in this embodiment is preferably cyclic voltammetry, which is a commonly used electrochemical research method. According to this method, an electrode potential is controlled to perform scanning at different scanning rates in such a manner as to form a triangular wave once or more over time. A potential range enables different reduction and oxidation reactions to occur alternately at the electrode, with a current-potential curve recorded. According to the shape of the curve, reversibility of an electrode reaction, intermediate, possibility of phase adsorption or new phase formation, nature of a coupling chemical reaction, and the like can be determined. The curve is commonly used to measure parameters of the electrode reaction, to determine control steps and reaction mechanism of the electrode reaction, and to observe what reactions occur and what natures these reactions have in an entire potential scan range. For a new electrochemical system, a preferred research method is often cyclic voltammetry, which can be referred to as "electrochemical spectrum." In addition to a mercury electrode, platinum, gold, glassy carbon, carbon fiber microelectrodes, and chemically modified electrodes can be used also.

The basic principle of cyclic voltammetry is as follows. If a pulse voltage of an isosceles triangle is applied to the working electrode, a resulting current-voltage curve will include two branches. If a first half potential scans towards the cathode, an electroactive material is reduced at the electrode, to generate a reduction wave. A second half potential then scans towards the anode, and a reduction product will be re-oxidized at the electrode, to generate an oxidation wave. Thus, a reduction and oxidation cycle is completed in one triangular wave scan. Such a procedure is thus termed cyclic voltammetry. The current-voltage curve thereof is termed cyclic voltammogram. If the electroactive material is of poor reversibility, the oxidation wave and the reduction wave will have different heights and inferior symmetry. The scanning rates of the potential in the cyclic voltammetry can be in the range from several millivolts to 1 volt per second.

A film prepared by electrochemical polymerization has more definite structure and polymerization degree. Compared with a traditional cross-linking procedure, electrochemical polymerization is advantageous for control in the polymerization procedure, as well as for subsequent structural characterization and control in the structure of the polymer film. Preparation of an electropolymerized film is simple and can be completed with small investment in equipment.

The hole transporting layer in this embodiment serves as an interface modification layer of the anode, and facilitates preparation of a multilayer solution processing device.

Embodiment 2

The present embodiment will be described in connection with FIG. 1. An organic electroluminescent diode having a multilayer structure in the present embodiment includes a substrate 1, and an anode 2, a hole injection layer 3, a hole transporting layer 4, a light-emitting layer 5, an electron injection layer 6, and a cathode that are successively stacked on the substrate 1 from inside to outside.

The anode 2 is an indium tin oxide semiconductor transparent conductive film made by a magnetron sputtering procedure, and has a thickness in the range from 20 to 200 nm.

Indium tin oxide is a mixture of indium oxide and tin oxide, usually containing 90% by mass of indium oxide and 10% by mass of tin oxide. Indium tin oxide, while in a film state, is transparent and colorless, and while in block state, is yellowish gray. The main feature of indium tin oxide lies in a combination of its electrical conductivity and optical transparence. However, in thin film deposition, it is necessary to make a compromise because a high concentration of charge carriers will increase conductivity of the material, but will reduce its transparency. An indium tin oxide film is typically deposited onto a surface by electron beam evaporation, physical vapor deposition, or sputter deposition techniques.

The indium tin oxide semiconductor transparent conductive film in the present embodiment is made by magnetron sputtering, and is characterized by appropriate shielding effectiveness in the range from 150 KHz to 1 GHz, much better light transmission than ordinary barrier material shield glass, resistivity ranging from 10−3 to 10−4 Ω·cm, and light transmittance higher than 85%.

Magnetron sputtering is a kind of physical vapor deposition (PVD). An ordinary sputtering procedure can be used for the preparation of metal, semiconductor, insulator, and other materials, and has the advantages such as simple equipment, easy to control, large coating area, and strong adhesion. The magnetron sputtering has achieved high speed, low temperature, and low damage. Because magnetron sputtering is performed at a high speed and a low pressure, it is necessary to effectively improve a gas ionization rate. In magnetron sputtering, a sputtering rate is increased through introduction of a magnetic field to a target cathode surface and increase in a plasma density by constraint of the magnetic field on charged particles.

Embodiment 3

The present embodiment will be described in connection with FIG. 1. An organic electroluminescent diode having a multilayer structure in the present embodiment includes a substrate 1, and an anode 2, a hole injection layer 3, a hole transporting layer 4, a light-emitting layer 5, an electron injection layer 6, and a cathode 7 that are successively stacked on the substrate 1 from inside to outside.

The hole injection layer 3 is a poly(3,4-ethenyldioxythiophene)poly(styrenesulfonate) film prepared by an inkjet printing procedure, and has a thickness in the range from 1 to 100 nm.

Poly(3,4-ethenyldioxythiophene)poly(styrenesulfonate), referred to as PEDT/PSS for short, is a series of high molecular polymers polymerized with EDOT monomer as raw material. It has the characteristics of high conductivity and transparency, superior light stability and thermal stability, favorable electrochemical performance, and can generate an effect in a thin layer less than 1 μm on a surface of an object, has satisfactory hydrolysis resistance, and is widely used in antistatic coatings, high conductive coatings, and organic light emitting diodes.

Inkjet printing is to spray, through a micron-level printing nozzle, hole transporting materials, and solutions of three-color luminescent materials red, green, and blue respectively in sub-pixel pits on a previously patterned ITO substrate, so as to form red, green, and blue three primary color luminescent pixel units. A thickness of a film is determined by an amount of solute printed in the pixel, and a film of homogeneous thickness can be obtained through adjustment of the volatility of a solvent. Through such a non-contact printing procedure, contact contamination to a functional solution can be avoided. This procedure can be used to greatly save expensive luminescent materials, and print through a nozzle having a plurality of ejection openings can substantially shorten film forming time. Thus, the inkjet printing technology has been recognized as a mainstream technology in industrial development in the field of OLED manufacture. Great progress has been made in equipment, raw materials, and device manufacturing procedures in recent years. Compared with the prior art, the inkjet printing technology significantly excels in saving raw materials and reducing costs. The inkjet printing technology requires an accurate positioning system to improve pixel resolution, and thus has high requirements in the accuracy of the equipment. In addition, how to prepare a printable high-efficiency luminescent material solution, to achieve a homogeneous thickness of the polymer film is a key to this technology.

An OLED made by inkjet printing has a simple structure, requiring neither complex backlights nor color filters in preparation of an LCD. Besides, inkjet printing technology can be used to save material significantly, such that the costs of OLEDs prepared with inkjet printing technology can be significantly reduced.

In general, a capacity balance of droplets sprayed from all ejection openings and trajectory deviation of the droplets sprayed by the ejection openings from a vertical direction are key factors in measurement of the quality of a print needle. The former determines thickness and homogeneity of the film within the pixel, while the latter is related to the accuracy of droplet positioning. The inkjet printing technology can be used to prepare high-performance OLED display screens under three conditions, i.e., high-precision inkjet printing equipment, high-performance soluble polymer luminescent materials, and preparation of print ink.

Embodiment 4

The present embodiment will be described in connection with FIG. 1. An organic electroluminescent diode having a multilayer structure in the present embodiment includes a substrate 1, and an anode 2, a hole injection layer 3, a hole transporting layer 4, a light-emitting layer 5, an electron injection layer 6, and a cathode 7 that are successively stacked on the substrate 1 from inside to outside.

The light-emitting layer 5 is a poly 9,9-dioctylfluorene film prepared by an inkjet printing procedure, and has a thickness in the range from 1 to 100 nm.

Light-emitting materials of organic light-emitting diodes can be divided into three categories, i.e., small organic molecule luminescent material, polymer luminescent material, and organic metal complex luminescent material.

Among these categories, the polymer luminescent material, as a class of important organic electroluminescent diode luminescent material, must have the following characteristics:

(1) high quantum efficiency fluorescence characteristics, with a fluorescence spectrum mainly distributed in a 400 to 700 nm visible light region;

(2) superior chemical and thermal stability, not reacting with an electrode or a carrier transport material;

(3) favorable film-forming property, generating no pinholes in a thin layer of dozens of nanometers; and (4) satisfactory semiconductor properties, i.e., being highly conductive or capable of transmitting either electrons or holes, or both.

At present, the polymer luminescent material is mainly conjugated polymer material, with excellent carrier transport properties, including polyphenylenevinylene and its derivatives, polythiophene and its derivatives, poly-para-phenylene and its derivatives, and polyfluorene and its derivatives. The material of the light-emitting layer in this embodiment belongs to polyfluorene and its derivatives.

Embodiment 5

The present embodiment will be described in connection with FIG. 1. An organic electroluminescent diode having a multilayer structure in the present embodiment includes a substrate 1, and an anode 2, a hole injection layer 3, a hole transporting layer 4, a light-emitting layer 5, an electron injection layer 6, and a cathode 7 that are successively stacked on the substrate 1 from inside to outside.

The electron injection layer is a lithium fluoride thin film prepared by vacuum deposition, and has a thickness in the range from 0.5 to 10 nm.

A large number of studies have shown that a higher crystallinity of a film is more favorable for carrier transport. It is generally believed that when being transported in an organic semiconductor thin film, carriers have to cross successive crystal unit cells. There is a large number of trap states between and among crystal boundaries. This will hinder the transportation of the carriers and improve the crystallinity of an active layer film. Thus, a larger grain size will lead to less grain boundaries that will generate trap states, and carrier mobility of a device can thereby be improved.

Lithium fluoride (LiF) is a most widely used and most maturely studied electrode modification layer material. In general explanations, use of LiF at the cathode can reduce a potential barrier between a work function of an electrode material and an LUMO level of an organic material, and enhance electron injection by increasing electron penetration or forming a dipole at an interface. Therefore, LiF, especially a LiF/Al composite electrode, has been widely used in OLEDs and N-type OTFTs.

A high work function metal can be used together with the LiF electrode modification layer to ensure electrode stability and device life, and meanwhile to enhance electronic injection, so as to improve the performance of the device. In addition, LiF is an insulating material, and while being used as the electrode modification layer, its thickness will significantly affect the performance of the device.

A second change brought about by LiF is an additional potential barrier added at the interface. Since LiF is an insulating material, the potential barrier can be understood as a resistance barrier added at the interface. This will cause some damage to electronic transmission. However, when LiF has an appropriate thickness, a total potential barrier will still be less than a potential barrier when there is no LiF.

Embodiment 6

The present embodiment will be described in connection with FIG. 1. An organic electroluminescent diode having a multilayer structure in the present embodiment includes a substrate 1, and an anode 2, a hole injection layer 3, a hole transporting layer 4, a light-emitting layer 5, an electron injection layer 6, and a cathode 7 that are successively stacked on the substrate 1 from inside to outside.

The cathode 7 is an aluminum film prepared by vacuum deposition, and has a thickness in the range from 50 to 1000 nm. In order to improve electron injection efficiency, it is necessary to select a material having a lowest possible work function as the cathode. Luminous brightness and service life of an organic electroluminescent diode are closely linked with the work function of the cathode. The lower the work function is, the higher the luminous brightness, and the longer the service life will be. At present, the cathode of the organic electroluminescent diode can substantially be a single metal cathode (one selected from the group consisting of Mg, Al, Li and Ca), an alloy cathode (one selected from the group consisting of Mg—Ag and Li—Al), a layered cathode, a doped composite electrode, etc. The cathode in this embodiment is an aluminum film, on which is a LiF film is formed, i.e., an alloy electrode is essentially used.

In a vacuum environment, a material is heated and plated onto a substrate, the procedure of which is termed vacuum deposition. It is a procedure of placing a material to be filmed into a vacuum for evaporation or sublimation, and precipitating the material on a surface of a workpiece or substrate.

A metal coating in vacuum deposition is usually an aluminum film, but other metals can also be deposited by evaporation.

The principle of vacuum deposition is to heat a metal to an evaporation temperature, after which a steam is transferred from a vacuum chamber and condenses on a low temperature part. This procedure is performed in a vacuum, and a metal vapor will reach a surface without being oxidized.

Although the present disclosure herein has been described with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims. It will be appreciated that the various dependent claims and the features set forth therein can be combined in different ways from those presented in the initial claims. It will also be appreciated that the features described in connection with individual embodiments may be shared with others of the described embodiments.

LIST OF REFERENCE SIGNS

1: substrate;
2: anode;
3: hole injection layer;
4: hole transporting layer;
5: light-emitting layer;
6: electron injection layer; and
7: cathode.

The invention claimed is:

1. An organic electroluminescent diode, comprising a hole transporting layer, which is a thin film formed through electrochemical polymerization;
   wherein material of the hole transporting layer is a "star" triphenylamine compound, and the thin film having a thickness in the range of 0.1 to 100 nm.

2. The organic electroluminescent diode according to claim 1, comprising: a substrate, and an anode, a hole injection layer, the hole transporting layer, a light-emitting layer, an electron injection layer, and a cathode that are successively stacked on the substrate from inside to outside.

3. The organic electroluminescent diode according to claim 2, wherein the anode is an indium tin oxide semiconductor transparent conductive film.

4. The organic electroluminescent diode according to claim 2, wherein the hole injection layer is a poly(3,4-ethenyldioxythiophene)poly(styrenesulfonate) film.

5. The organic electroluminescent diode according to claim 2, wherein the light-emitting layer is a poly 9,9-dioctylfluorene film.

6. The organic electroluminescent diode according to claim 2, wherein the electron injection layer is a lithium fluoride film.

7. The organic electroluminescent diode according to claim 2, wherein the cathode is an aluminum film.

* * * * *